United States Patent
Kiyohara et al.

(10) Patent No.: US 8,048,718 B2
(45) Date of Patent: Nov. 1, 2011

(54) SEMICONDUCTOR DEVICE COMPRISING AN EXCESS RESIN PORTION, MANUFACTURING METHOD THEREOF, AND APPARATUS FOR MANUFACTURING SEMICONDUCTOR DEVICE COMPRISING A EXCESS RESIN PORTION

(75) Inventors: Toshinori Kiyohara, Kawasaki (JP); Yoshiharu Kaneda, Sakai (JP); Yoshikazu Takada, Sakai (JP)

(73) Assignee: Renesas Electronics Corporation, Kanagawa (JP)

( * ) Notice: Subject to any disclaimer, the term of this patent is extended or adjusted under 35 U.S.C. 154(b) by 885 days.

(21) Appl. No.: 11/882,415

(22) Filed: Aug. 1, 2007

(65) Prior Publication Data
US 2008/0029857 A1 Feb. 7, 2008

(30) Foreign Application Priority Data
Aug. 7, 2006 (JP) .................. 2006-214636

(51) Int. Cl.
*H01L 21/00* (2006.01)

(52) U.S. Cl. ........ 438/111; 438/112; 438/113; 438/123; 438/124; 438/106; 438/107; 438/110; 257/667; 257/788; 257/E21.237

(58) Field of Classification Search .......... 438/111–113, 438/123, 124, 106, 107, 110; 257/667, 788, 257/E23.237
See application file for complete search history.

(56) References Cited

U.S. PATENT DOCUMENTS
5,808,355 A * 9/1998 Kim et al. ............... 257/666
6,341,549 B2 * 1/2002 Kim ........................... 83/99

FOREIGN PATENT DOCUMENTS
| JP | 63-73656 | | 4/1988 |
| JP | 1-296650 | | 11/1989 |
| JP | 2-205060 | | 8/1990 |
| JP | 02205060 A | * | 8/1990 |
| JP | 4-271151 | | 9/1992 |
| JP | 7-297339 | | 11/1995 |
| JP | 11-347645 | | 12/1999 |

OTHER PUBLICATIONS

Japanese Official Action—2006-214636—Feb. 22, 2011.
Japanese Official Action—2006-214636—Nov. 30, 2010.

* cited by examiner

*Primary Examiner* — Junghwa M Im
(74) *Attorney, Agent, or Firm* — Young & Thompson

(57) ABSTRACT

A partly finished product of a semiconductor device includes a resin body encapsulating a semiconductor chip, first and second leads extended outwardly from the resin body, a dam bar connected between said first and second leads, and an excess resin portion protruding from the resin body between the first and second leads and the dam bar. The excess resin portion is cut off at two limited portions, and thereby two groove portions are formed in the excess resin portion. An apparatus for cutting the dam bar includes a punch having a cutting edge for cutting connection portions between the first and second leads and the dam bar and for cutting off the two limited portions of the excess resin portion. Since the cut region of the excess resin portion becomes smaller, a stress imparted to the resin body and/or the semiconductor chip through the excess resin portion can be smaller.

8 Claims, 11 Drawing Sheets

US 8,048,718 B2

SEMICONDUCTOR DEVICE COMPRISING AN EXCESS RESIN PORTION, MANUFACTURING METHOD THEREOF, AND APPARATUS FOR MANUFACTURING SEMICONDUCTOR DEVICE COMPRISING A EXCESS RESIN PORTION

CROSS-REFERENCE TO RELATED APPLICATIONS

This application is based upon, claims the benefit of priority of, and incorporates by reference the contents of Japanese Patent Application No. 2006-214636 filed on Aug. 7, 2006.

BACKGROUND

1. Field of the Invention

The present invention relates to a semiconductor device comprising an excess resin portion, a manufacturing method thereof and an apparatus for manufacturing the semiconductor device comprising a excess resin portion.

2. Description of Related Art

A manufacturing method of a semiconductor device, generally includes: a step of preparing a lead frame having a plurality of leads and a plurality of dam bars for connecting the plurality of leads; a step of mounting a semiconductor chip on the lead frame; a step of encapsulating the semiconductor chip in a resin body; and a step of cutting and removing the dam bars and separate into individual semiconductor devices. FIG. 1 illustrates a schematic plan view of a partly finished product of a semiconductor device where a plurality of semiconductor devices is manufactured on the lead frame 2. FIG. 2 illustrates an enlarged schematic view of one semiconductor device illustrated in FIG. 1. The lead frame 2 includes a plurality of leads 2b (bar line portions) extending in the lateral direction on the drawing from a resin body 3, and a plurality of dam bars 2a (hatched line portions) each connecting between two adjacent leads 2b. In a step of encapsulating a semiconductor chip (not illustrated in the figure), usually, an excess resin portion 4 is formed in a region surrounded by the resin body 3, two adjacent leads 2b and the dam bar 2a connecting between the two adjacent leads 2b. Usually, the excess resin portions 4 have a thickness equivalent to that of the lead frame 2. Since the excess resin portions 4 are formed simultaneously with the resin body 3 at the time of resin encapsulating.

The cut mode of the dam bars of a related art will be described. FIG. 3 illustrates a schematic plan view at a time when the dam bars 2a are cut by using punches 15. The dam bars 2a are cut by using the punches 15 and a cutting die which is not illustrated in the figure. In FIG. 3, each of the punch 15 is illustrated as a planar projected form of each of the cutting edge thereof, and it has a rectangular shape. Portions thereof except for the cutting edge (for example, a portion of a blade of the punch, or the like) are not illustrated. When cutting the dam bars 2a, in order to cut them reliably, a part of the punches 15 are caused to overlap even with the excess resin portions 4 in consideration of a positional shift between the dam bars 2a and the punches 15. For this reason, at the same time when the dam bars 2a are cut, a part of the excess resin portions 4 will be also punched through.

FIG. 4 illustrates a partial schematic view of a semiconductor device 11 after the plurality of dam bars are cut by using the punches 15 illustrated in FIG. 3. The part of the excess resin portions 4 overlapping with the punches 15 are punched through, leaving a plurality of excess resin portions 14 are remained. On each of the outer edge of the remaining excess resin portions 14, a cut line 14a is formed between each left lead 2b and each right lead 2b.

In addition, as the gap increases between the dam bar 2a and the resin body 3, the area of the remaining excess resin portion 14 becomes large so that the remaining excess resin portion 14 might inconveniently drop off, which may require a step of removing the remaining excess resin portion 14 besides the step of cutting the dam bar 2a.

In the manufacturing methods of a semiconductor device described in Japanese Patent Laid-Open Nos. 63-73656 and 07-297339, a lead frame outward of the resin body is provided with openings having a width wider than the cut width of the dam bar only at portions close to the resin body. Moreover, as another means, by reducing the gap between the dam bar and the resin body (for example, equal to or smaller than 0.3 mm) so as to cause the excess resin portion to be small, the step of removing the excess resin portion is eliminated. Moreover, in a dam bar cutting mold described in Japanese Patent Laid-Open No. 11-347645, the punch portion overlapping with the excess resin portion part has a trapezoidal shape which converges from the base portion (dam bar side) to the tip end portion (resin body side) to prevent the excess resin portion from dangling when the dam bar is cut.

We have now recognized that, according to the above-mentioned prior art, the semiconductor chip inside the resin body 3 and the resin body 3 will suffer from defects such as cracks. When the dam bars 2a are cut using rectangular punches 15 as illustrated in FIG. 3, or punches each having a trapezoid cut plane as described in Japanese Patent Laid-Open No. 11-347645, the excess resin portions 4 will be punched through at the vicinity of the resin body 3. Since the shape of the punches 15 in FIG. 3 has large overlapping area between the excess resin portions 4 and the punches 15, strong stress will be imparted to the resin body 3 through the excess resin portions 4. Because, due to a low rigidity of the excess resin portion 4, tearing stress will be generated when the excess resin portions 4 are cut by the punches 15. Therefore, defects such as cracks may occur in the semiconductor chip inside the resin body 3 or the resin body 3. In particular, with the recent miniaturization and thinning of electronic equipment, the semiconductor device used in the electronic equipment is also miniaturized and thinned, and therefore defects tend to occur more easily.

Further, a large overlapping area of the excess resin portions 4 and the punches 15 increases the amount of generated debris of the excess resin portion. Therefore, in a successive operation of cutting the dam bars, a problem in dam bar cutting may occur due to the debris of the excess resin portion entering in the cutting die.

SUMMARY

The present invention seeks to solve or to improve one or more of the above problems at least in part by reducing a size of a cut region of an excess resin portion so as to reduce a stress imparted to a resin body through the excess resin portion when a dam bar is cut.

In one feature of the present invention, a semiconductor device comprises the excess resin portion protruding from the resin body between first and second leads. The excess resin portion has first, second and third terminating edges in an outer edge opposed to the resin body. The second terminating edge is sandwiched between the first and third terminating edges and distant from the resin body than the first and third terminating edges.

In another feature of the present invention, a method for manufacturing the semiconductor device comprises cutting connection portions between the first lead and the dam bar and between the second lead and the dam bar and cutting off a part of the excess resin portion. The first, second and third terminating edges are formed in the excess resin portion. The first and third terminating edges are distant from the second terminating edge. The second terminating edge is sandwiched between the first and third terminating edges and abuts on the dam bar.

In another feature of the present invention, an apparatus for the manufacturing the semiconductor device comprises a punch having a cutting edge for cutting connection portions between the first lead and the dam bar and between the second lead and the dam bar and for cutting off the part of the excess resin portion. The cutting edge enables to forms the first, second and third terminating edges in the excess resin portion.

We have devised a cutting off region of the excess resin portion to be smaller as at least two groove portions corresponding to the first and third terminating edges so that the major part of the excess resin portion, the second terminating edge i.e. is not cut by the punch at any region other than the cutting off region. The cutting off region of the excess resin portion is cut off in order to cut the dam bar reliably. In other words, we have formed a projected shape of the cutting edge of the punch as comprising at least two convex portions for cutting out at least two groove portions of the excess resin portion and a concave portion interposed between them, so that the concave portion does not cut the excess resin portion. Since the dam bar has high rigidity thereby tearing stress hardly occurs, by cutting the dam bar by the concave portion, stress against the excess resin portion can be minimal. Incidentally, the boundary between the excess resin portion and the dam bar may be cut instead of cutting the dam bar. In this case there is possibility of occurrence of tensile stress in the excess resin portion rather than cutting the dam bar, but which is smaller than that when the excess resin portion is cut as the above-mentioned related art. As a result, the stress imparted to the resin body through the excess resin portion when the dam bar is cut, can be smaller, thereby, even for a miniaturized and thin semiconductor device, it is possible to prevent cracks from occurring in the semiconductor chip and/or the resin body.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of present invention and that the invention is not limited to the embodiments illustrated for explanatory purposes.

Figure 1:
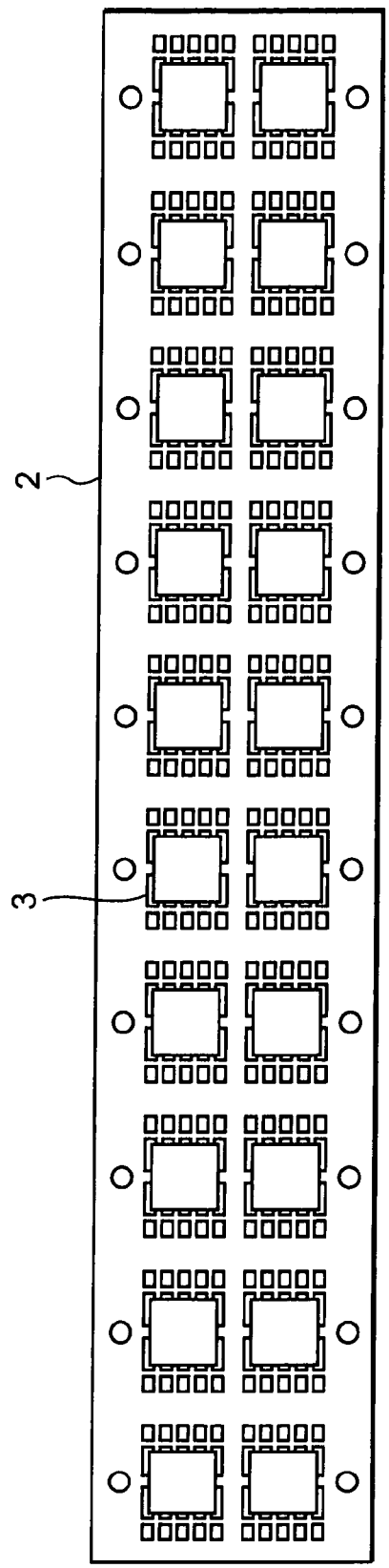
FIG. 1 is a schematic plan view of a partly finished product of a prior art semiconductor device.
Figure 2:
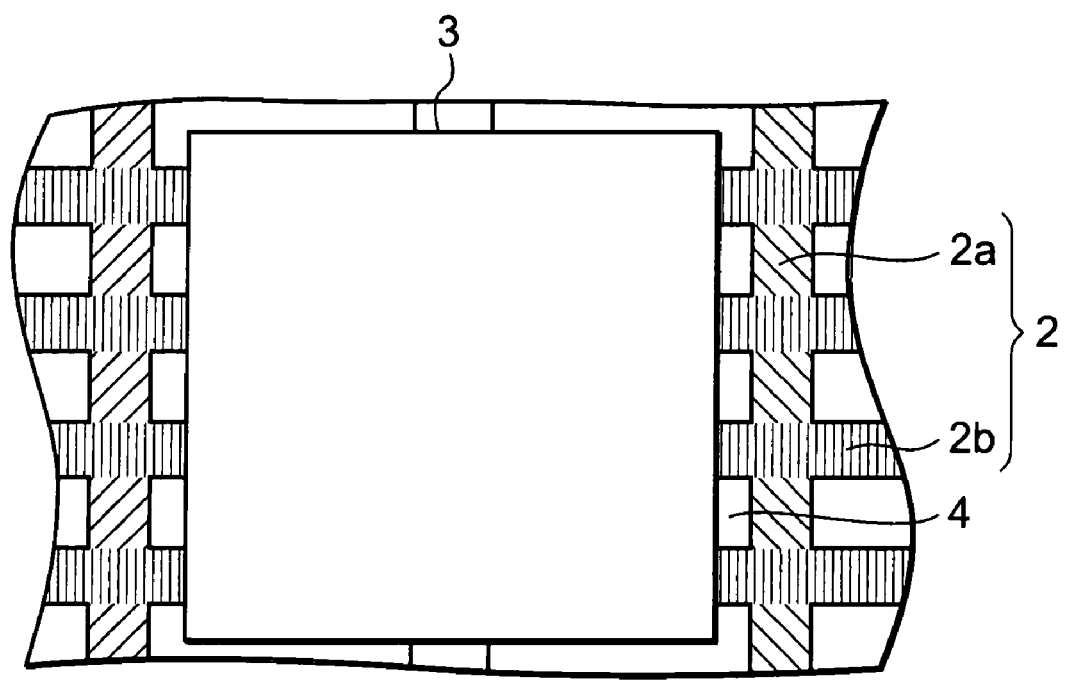
FIG. 2 is a schematic enlarged view of the partly finished product of the semiconductor device illustrated in FIG. 1.
Figure 3:
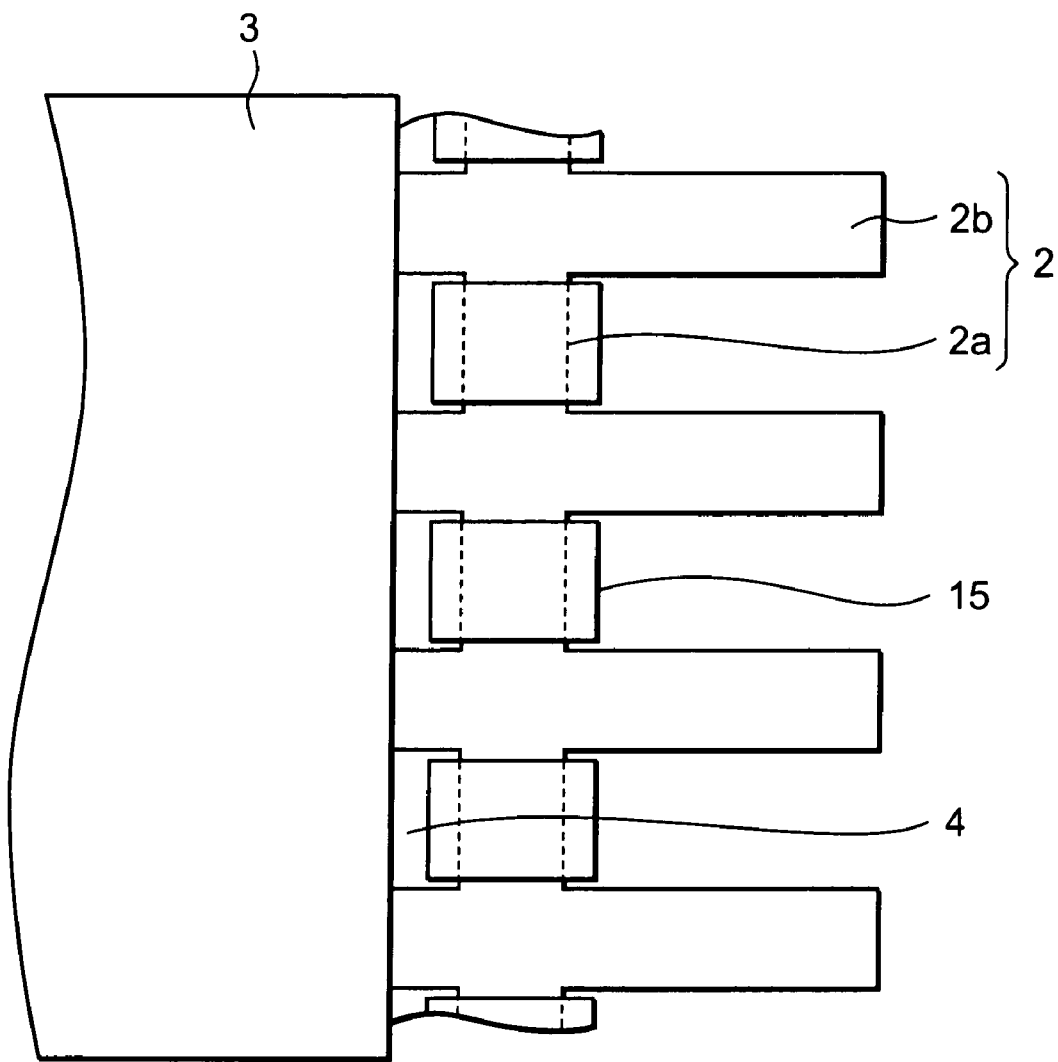
FIG. 3 is a schematic plan view of a related art semiconductor device illustrating a state when a plurality of dam bars 2a is cut off.
Figure 4:
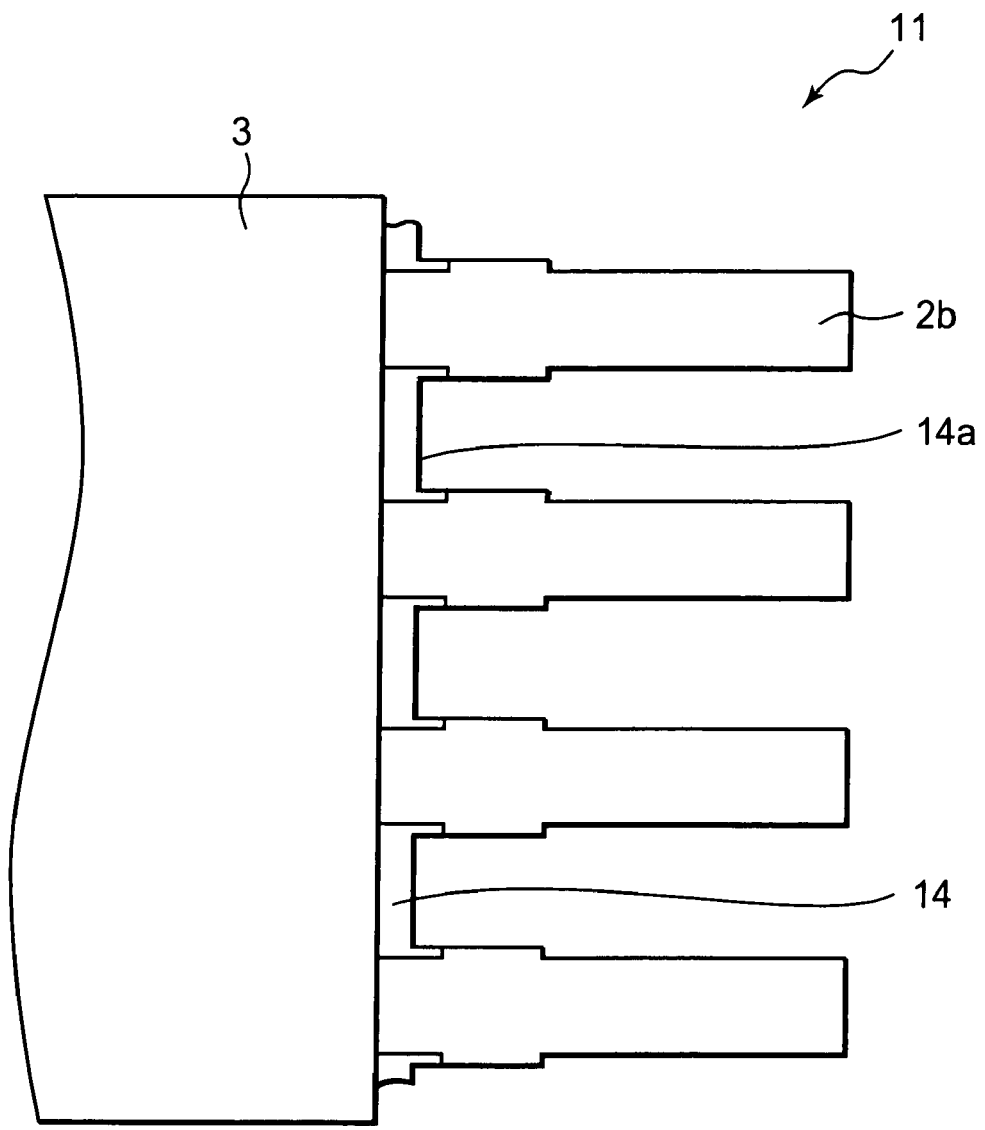
FIG. 4 is the partly schematic view of a semiconductor device 11 in FIG. 3 after the plurality of dam bars 2a is cut off.
Figure 5:
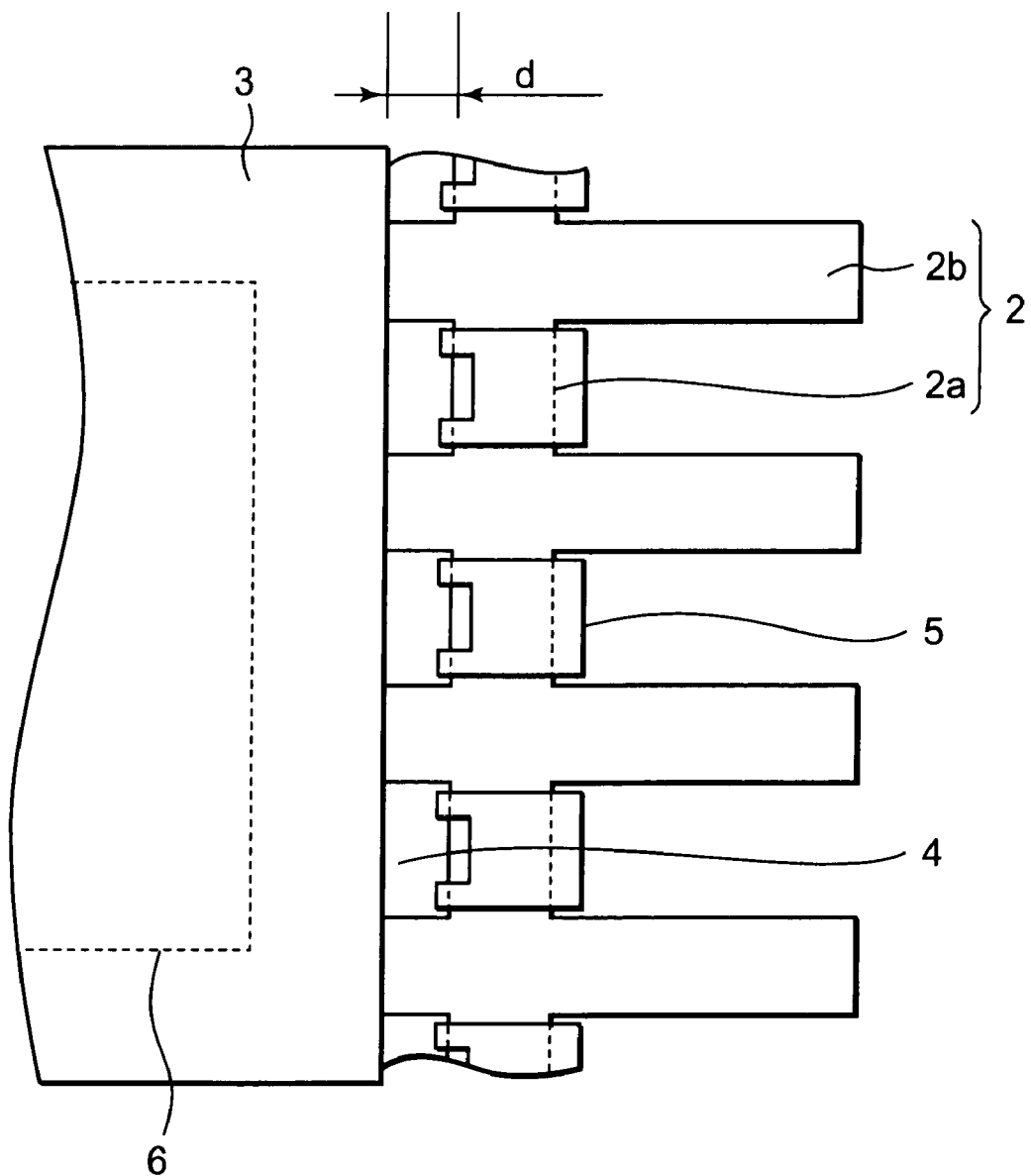
FIG. 5 is a schematic plan view of a first embodiment of the present invention, illustrating the state when a plurality of dam bars 2a is cut off.
Figure 6:
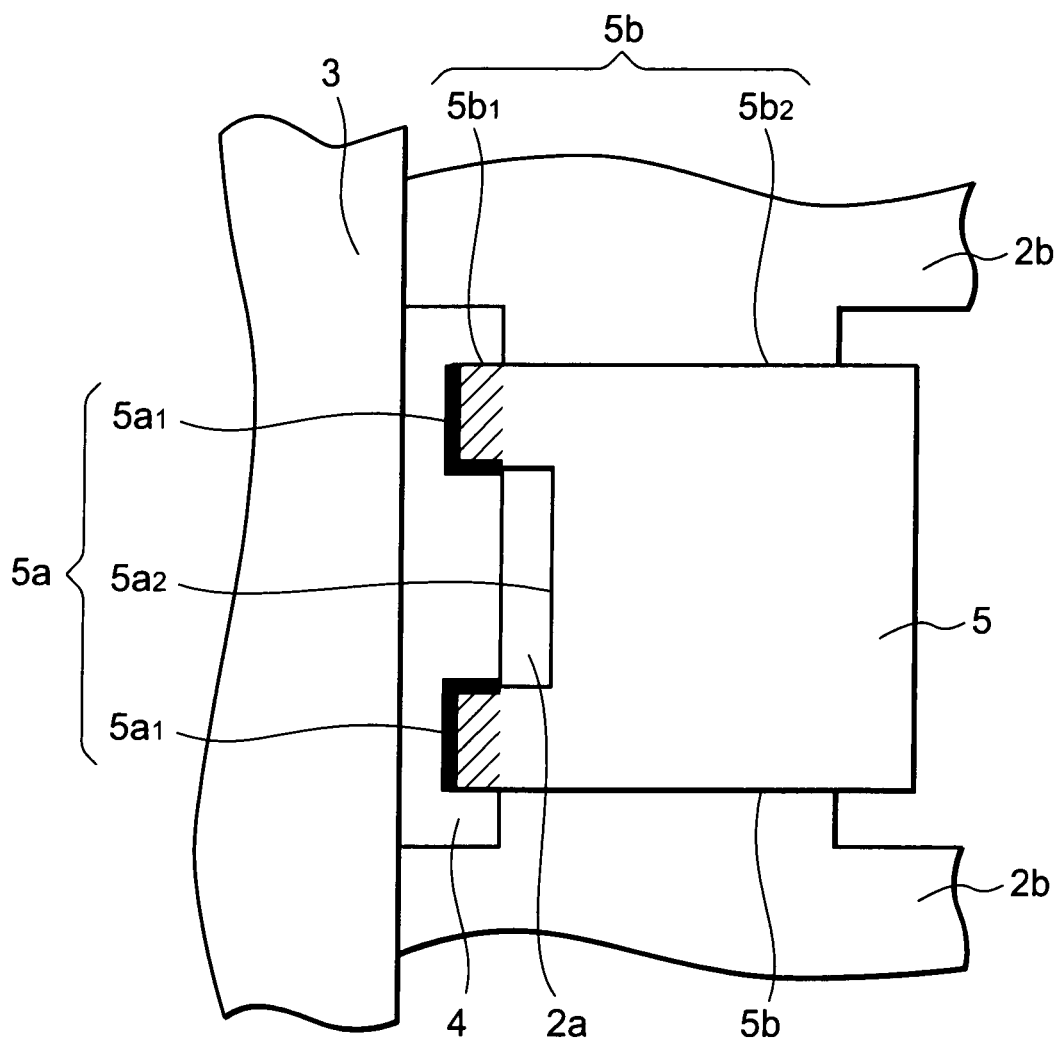
FIG. 6 is a schematic enlarged view at the vicinity of a punch 5 illustrated in FIG. 5.

FIG. 5 is a schematic plan view of a first embodiment of the present invention, illustrating the state when a plurality of dam bars 2a of the partly finished product of a semiconductor device is cut off. FIG. 6 is a schematic enlarged view at a vicinity of the punch 5 illustrated in FIG. 5. Shape of the punch 5 shown in FIGS. 5 and 6 is illustrated shape of the cutting edge of the punch projected on a plane. Portions thereof except for the cutting edge (for example, a portion of a blade of the punch, or the like) are not illustrated in figures. First, a semiconductor chip 6 is mounted on a lead frame 2 including a plurality of leads and a plurality of dam bars 2a each connecting between one of the plurality of leads and another one of the plurality of leads. Afterwards, the semiconductor chip 6 is encapsulated by a resin body 3. Similar to the case of FIG. 1, this results in a plurality of resin bodies 3 on the lead frame 2. At each region surrounded by the resin body 3, two adjacent leads 2b (corresponding to first and second leads), and the dam bar 2a connecting between the two adjacent leads 2b, an excess resin portion 4 is formed.

It is preferable for the gap "d" between the resin body 3 and the dam bar 2a (refer to FIG. 5), to be less than 0.5 mm, preferably 0.3 mm, more preferably 0.15 mm, and further preferably 0.1 mm, so that a length of the excess resin portion 4 formed in the resin encapsulating step is to be short. If the length (equal to d) of a remaining excess resin portion after cutting the dam bar is long, a probability that a connection portion of the remaining excess resin portion and the resin body 3 breaks when the semiconductor device is carried or used, and, thereby, the remaining excess resin portion drops from the resin body 3, will be higher. Since the probability of excess resin portion dropping becomes lower as the length of the remaining excess resin portion becomes shorter, the step of removing the remaining excess resin portion will not be necessary. Moreover, cracks due to the removal of the remaining excess resin portion also do not occur in the semiconductor chip 6 and/or the resin body 3.

Next, using the punches 5, the dam bars 2a are removed. The method for cutting the dam bar and a shape of the punch will be described in more detail with reference to FIG. 6. At the region in resin body 3 side of the punch 5, two convex portions (hatched line portions; corresponding to first and second convex portions) are formed so as to overlap with the excess resin portion 4, at places near both sides of the leads 2b in order to cut the dam bar 2a surely. Mean while, in the intermediate region interposed by the convex portions at both sides of the punch 5, a concave portion is formed so as not to overlap with the excess resin portion 4.

The punch 5 comprises a first cutting edge 5a (corresponding to inner portions of the convex portions and the concave portion) and second cutting edges 5b provided to both sides of the first cutting edge 5a. The second cutting edge 5b facing to the lead 2b is fully traversed on the dam bar 2a so as to surely cut the dam bar 2a. In other words, a portion 5b1 (an outer portion of the convex portion) of the second cutting edge 5b protrudes over the dam bar 2a and overlaps with the excess resin portion 4. And a portion 5b2 of the second cutting edge 5b overlaps with the dam bar 2a, and further protrudes over the dam bar 2a and extends outward. The portions 5b1 formed on both sides of the punch 5 are connected by the first cutting edge 5a at a side of the resin body 3. It should be appreciated that the portions 5a1 (heavy line portions) at both sides of the first cutting edge 5a overlap with the excess resin portion 4 because the portions 5b1 of the second cutting edge 5b are present on the excess resin portion 4. Mean while the central portion 5a2 (thin line portion; corresponding to the concave portion) of the first cutting edge 5a overlaps with the dam bar 2a without overlapping with the excess resin portion 4. Namely, the first cutting edge 5a has a zigzag shape. Since this limits cut regions of the excess resin portion 4 to each of the convex portions respectively formed with the portion 5a1 of the first cutting edge 5a and the portion 5b1 of the first cutting edge 5b connecting with the portion 5a1, and enables the area of the punch 5 overlapping with the excess resin portion 4 to be small, thus, enabling stress imparted to the semiconductor chip 6 and/or the resin body 3 through the excess resin portion 4 to be small. Moreover the amount of the punched through excess resin portion 4 can also be reduced.

In addition, the portions 5a1 and 5a2 of the first cutting edge 5a, and the portions 5b1 and 5b2 of the second cutting edge 5b, can be continuously extended in a state where the boundaries between them are not determined. In this case, the portion 5b2 can be indicated as a portion not overlapping with the excess resin portion 4, and the portion 5b1 can be indicated as a portion continuing with the portion 5b2 and overlapping with the excess resin portion 4. Moreover, the portion 5a1 can be indicated as a portion overlapping with the excess resin portion 4, and the portion 5a2 can be indicated as a portion continuing with the portion 5a1 and not overlapping with the excess resin portion 4 (it may overlap with the dam bar 2a).

The lengths of the portions 5a1 and 5a2 of the first cutting edge 5a, and the portions 5b1 and 5b2 of the second cutting edge 5b, and the area and the shape etc. of a region where the punch 5 overlaps with the excess resin portion 4 can be arbitrarily set depending on the designs of the lead frame and the resin body etc. Incidentally, the cutting edge of the punch 5 including the two convex portions and the one concave portion interposed between them is illustrated in FIGS. 5 and 6, the numbers of the convex portion and the convex portion are not limited to these, they can be increased if necessary.

Figure 7:
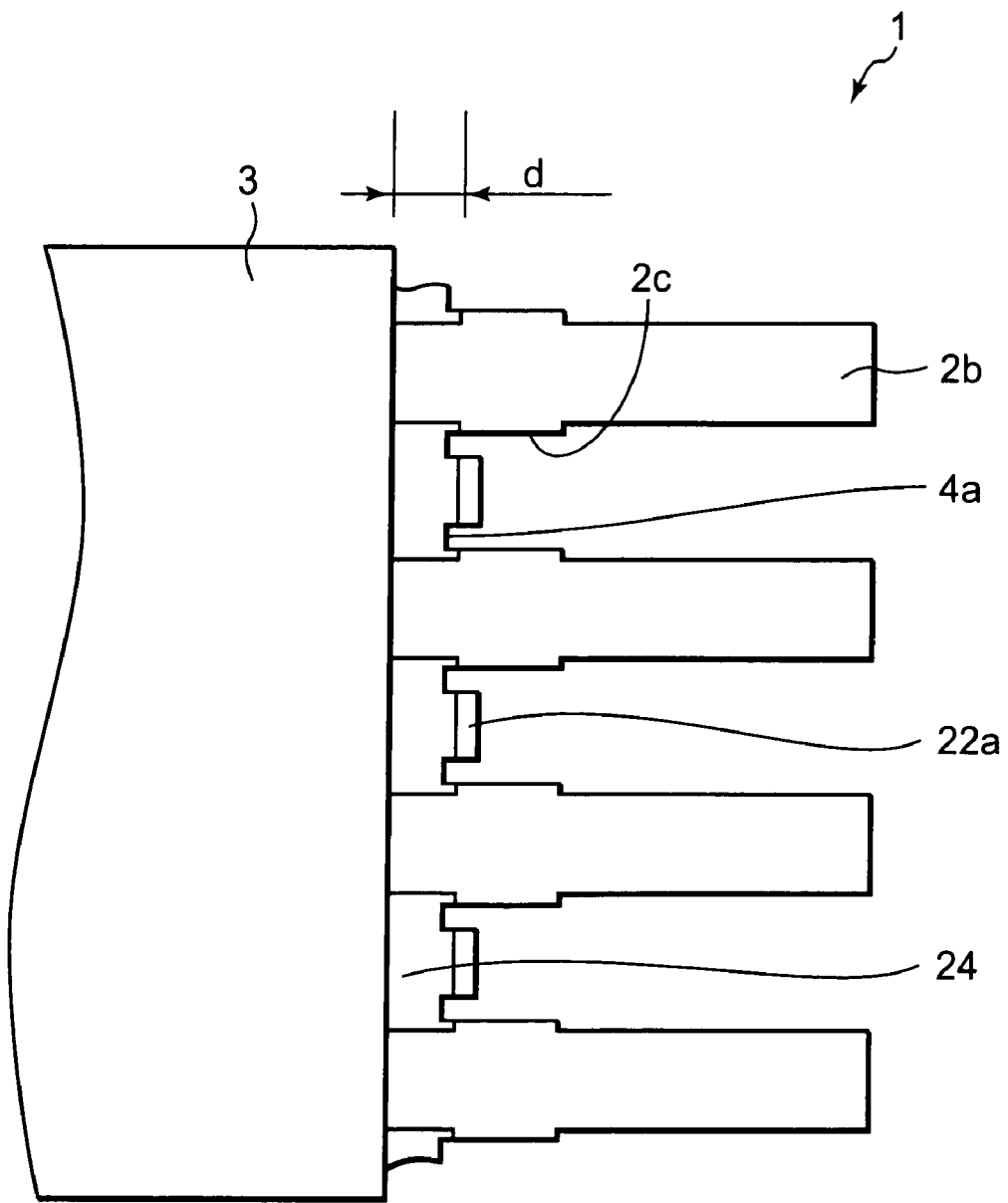
FIG. 7 is a partial schematic view of a semiconductor device 1 in FIG. 5 after the plurality of dam bars 2a is cut off.
Figure 8:
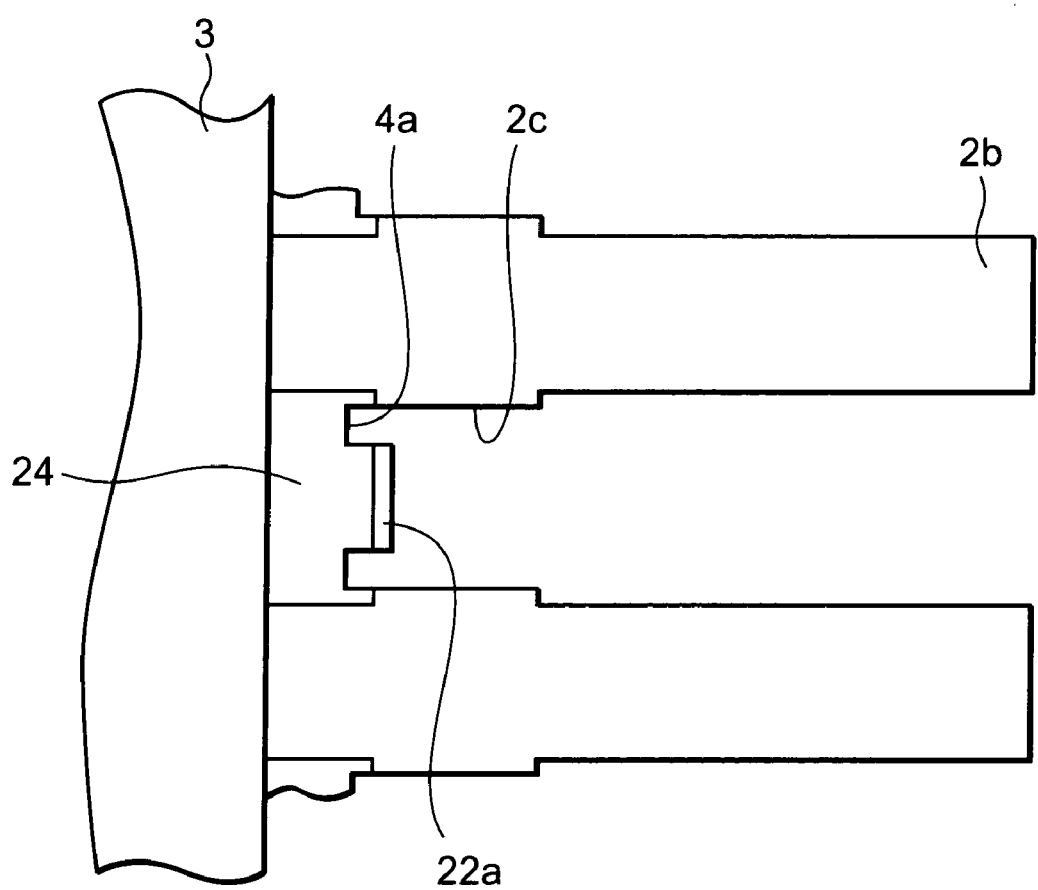
FIG. 8 is a schematic enlarged view at the vicinity of a remaining excess resin portion 24 illustrated in FIG. 7.

FIG. 7 illustrates a partial schematic view of a semiconductor device 1 where the dam bars 2a are cut off by using the punches 5 illustrated in FIGS. 5 and 6. FIG. 8 illustrates an enlarged schematic view of the vicinity of a remaining excess resin portion 24. In the leads 2b, cut lines 2c at which the dam bar 2a has been cut off, are formed. A portion (corresponding to a second portion) of the lead 2b that is connected to the dam bar 2a is larger in width than a portion (corresponding to a first portion) of the lead 2b that is sandwiched between the first portion and the resin body 3. Each of the remaining excess resin portion 24 of the semiconductor device 1 includes at least two groove portions 4a (corresponding to first and third terminating edges) formed by the punch 5 at the convex portions thereof. The cut lines of the groove portions 4a (lines cut at the portions 5b1 of the second cutting edges 5b) adjacent to the leads 2b are continuing with the cut lines 2c (lines cut at the portions 5b2 of the second cutting edges 5b) of the leads 2b.

Moreover, after the dam bar 2a is cut off, in the semiconductor device 1, a part of the dam bar 2a still remains as a metal piece between the groove portions 4a, while connecting to the remaining excess resin portion 24. The cut line of the remaining dam bar 22a (a line that is cut at the portion 5a2 of the first cutting edge 5a) continues to the cut lines (lines that are cut at the portions 5a1 of the first cutting edge 5a) of the groove portions 4a. Since the remaining dam bar 22a is firmly adhered to the remaining excess resin portion 24, when the remaining dam bar 22a is tried to be removed, there are high possibilities of impartment of large stress to the resin body 3 through the remaining excess resin portion 24 and occurrence of the unnecessary debris of the remaining excess resin portion 24. Therefore, it is preferable to leave the remaining dam bar 22a instead of being removed if it is less likely to drop off.

Figure 9:
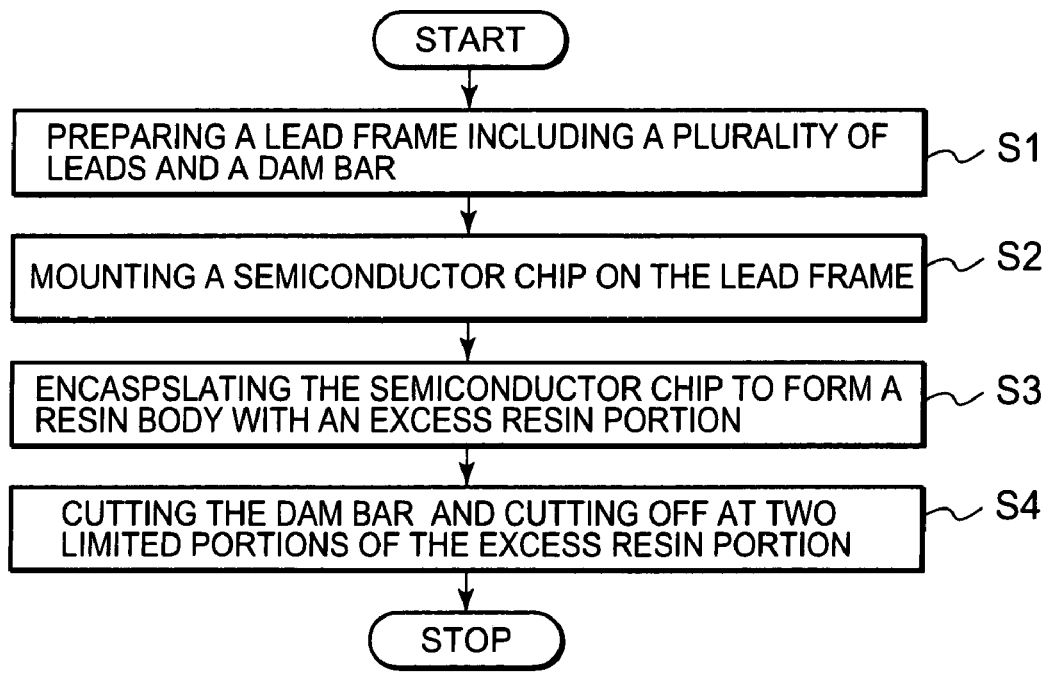
FIG. 9 is a flowchart illustrating the method for manufacturing a semiconductor device of the first embodiment of the present invention.

FIG. 9 is a flowchart illustrating the method for manufacturing a semiconductor device of a first embodiment of the present invention. The semiconductor device 1 is finished by the following steps of preparing a lead frame including a first and second leads and a dam bar connecting between them (S1), mounting a semiconductor chip on the lead frame (S2), encapsulating the semiconductor chip to form a resin body and a excess resin portion (S3), and cutting the connection portions between the leads and the dam bar and cutting off at two limited portions of the excess resin portion, and thereby two groove portions are formed in the excess resin portion (S4).

In FIGS. 10A to 10F, modified examples of the punch 5 of an apparatus for manufacturing the semiconductor device of the present invention, are illustrated. The punch 5 illustrated in FIGS. 10A to 10F, as mentioned above, includes the two second cutting edges 5b for separating the connection portions between the dam bar 2a and the leads 2b, and the first cutting edge 5a connected between the two second cutting edges 5b. The first cutting edge 5a is designed so that both side portions thereof overlap with the excess resin portion 4 and the central portion thereof does not overlap with the excess resin portion 4 (overlap, for example, with the dam bar 2a). In particular as illustrated in FIGS. 10A to 10F, the shape of the punch 5 has two convex portions 5c in both side regions at the side facing to the resin body 3 and a concave portion 5d interposed between the convex portions 5c in the central region. When the dam bar is cut, each of the tip end portions of the convex portions 5c will overlap with the excess resin portion 4 and the bottom portion of the concave portion 5d will not overlap with the excess resin portion 4 (overlap, for example, with the dam bar). By this, although causing the area of the punch 5 overlapping with the excess resin portion 4 to be small, the stress imparted to the resin body through the excess resin portion can be smaller during cutting the dam bar 2a.

Figure 10A:
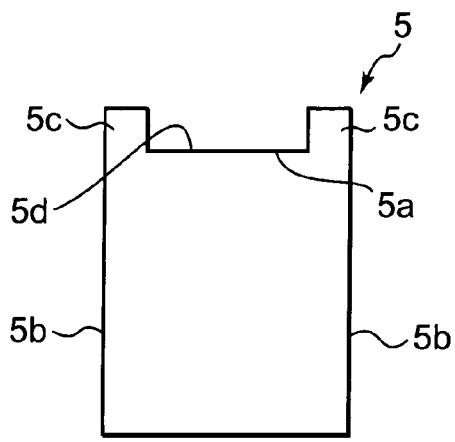
FIGS. 10A to 10F illustrate modified examples of a punch 5 of the first embodiment of the present invention.
Figure 10B:
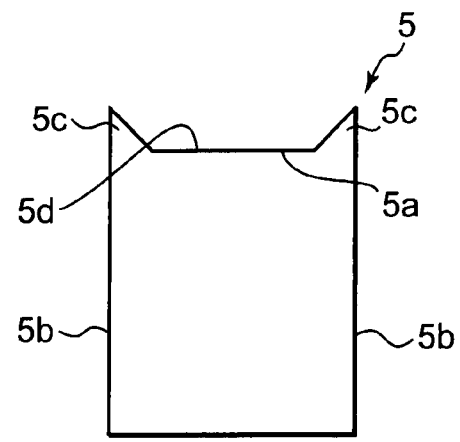
Figure 10C:
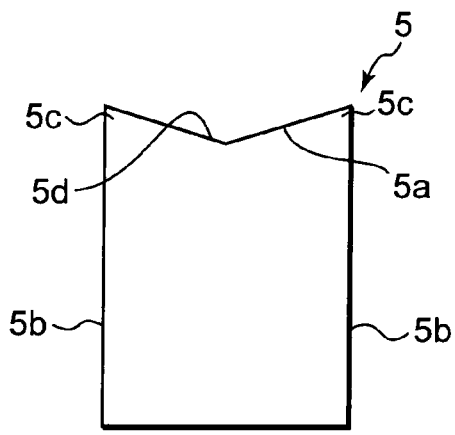
Figure 10D:
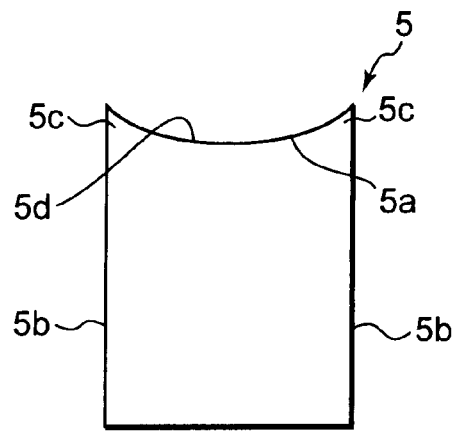
Figure 10E:
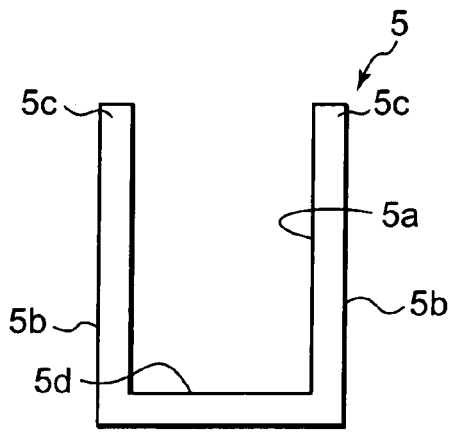
Figure 10F:
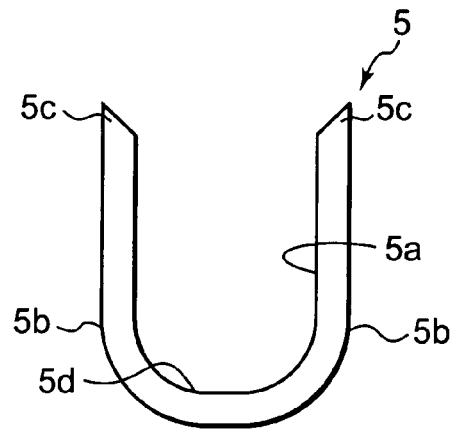

In the example illustrated in FIG. 10A, the shape has rectangular convex portions 5c and a U shaped concave portion 5d (the portion 5a2 of the first cutting edge 5a has a U shape). In an example illustrated in FIG. 10B, the shape has mountain-like convex portions 5c and a dish-like concave portions 5d. In an example illustrated in FIG. 10C, the portions 5a1 and 5a2 of the first cutting edge 5a make a seamless V shape and the shape of the punch 5 has mountain-like convex portions 5c and a valley-like concave portion 5d. In an example illustrated in FIG. 10D, the portions 5a1 and 5a2 of the first cutting edge 5a make a seamless arc shape (U shape) and the shape of the punch 5 has convex portions 5c made of curves and lines and a curved concave portion 5d. In an example illustrated in FIG. 10E, the punch 5 is formed in a concave shape (U shape) with convex portions 5c and a concave portion 5d as a whole. In an example illustrated in FIG. 10F, the punch 5 is formed in a concave shape (U shape) with convex portions 5c and a concave portion 5d as a whole.

Figure 11:
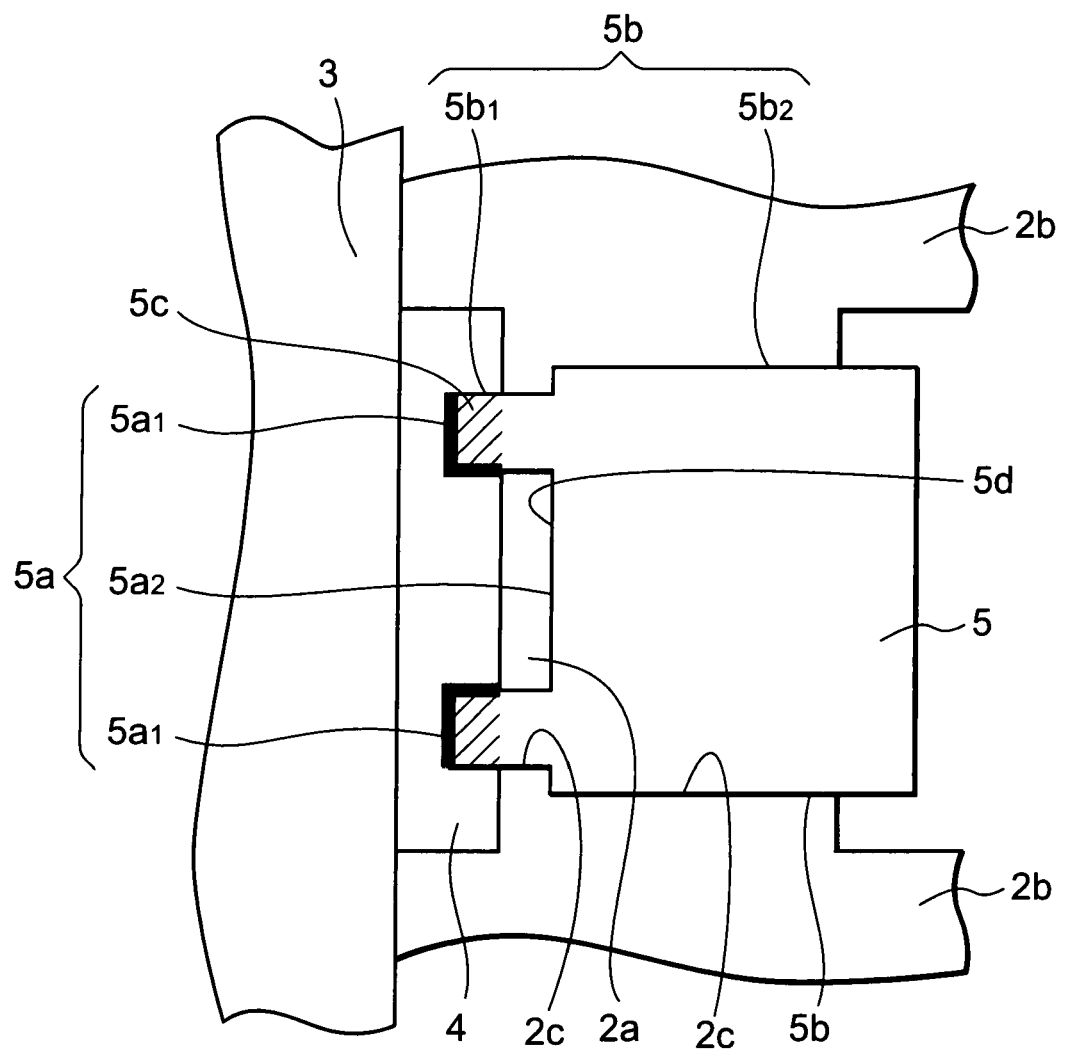
FIG. 11 is a schematic plan view of another modified example of the present invention.

Further, FIG. 11 illustrates another modified example of the punch 5. The punch 5 in FIG. 11 has zigzag portions 5b2 of the second cutting edge 5b. Therefore, cut lines 2c where the dam bar 2a is cut off has a zigzag shape, and a gap between the convex portion 5c and the lead 2b becomes wider than that of the above-mentioned example. The remaining portion of the dam bar 2a connected to the lead 2b at a portion near the excess resin portion 4 becomes larger than that of the above-mentioned example, however, since the connection portion between the dam bar 2a and the leads 2b is cut off surely, there is no electrical problem. In other word, the second cutting edge 5b is not limited to a straight shape in parallel with the length direction of the leads 2b, it may be a curved shape or a zigzag shape, etc.

Although the inventions has been described above in connection with several preferred embodiments thereof, it will be appreciated by those skilled in the art that those embodiments are provided solely for illustrating the invention, and should not be relied upon to construe the appended claims in a limiting sense. For example, the shape of the punch 5 (the planar projected shape of the cutting edges) is not limited to that of the above-mentioned examples, it can be modified and changed within a range that does not departing from the scope and spirit of the invention. Moreover, the numbers of the convex portion and the concave portion of the cutting edge can be increased if necessary, and the positions where they are formed can also be changed. In addition, the shape of the punch 5 illustrated in the figure illustrates an example of the planar projected shape of the cutting edge, and does not limit the shape of another part of the punch such as a blade etc. Moreover, the cutting die in the apparatus for manufacturing the semiconductor device of the present invention is designed so as to match with the form of the punch.

What is claimed is:

1. A method for manufacturing a semiconductor device comprising the steps of:
    providing a semiconductor device comprising a resin body encapsulating a semiconductor chip therein, a first and second leads extended outwardly from said resin body, a dam bar connected between said first and second leads, and an excess resin portion protruding from said resin body between said first and second leads and said dam bar; and
    cutting connection portions between said first lead and said dam bar and between said second lead and said dam bar by a punch,
    wherein said punch has a first cutting edge and two of second cutting edges, said two of second cutting edges are arranged in parallel to each other, said first cutting edge is sandwiched between said two of second cutting edges, said first cutting edge has first and second convex portions and a concave portion, said concave portion is sandwiched between said first and second convex portions, and
    wherein in said cutting step, said punch is positioned in such a way that said two of second cutting edges are located at said dam bar so as to face to said first and second leads, respectively, each tip portion of said first and second convex portions is located at said excess resin portion, and a mid portion of said concave portion is located at said dam bar, then punch a part of said excess resin portion and a part of said dam bar with said punch.

2. The method for manufacturing a semiconductor device according to claim 1, wherein each of said two of said cutting edges of said punch has a straight edge.

3. The method for manufacturing a semiconductor device according to claim 2, wherein said concave portion of said first cutting edge of said punch has a straight edge.

4. The method for manufacturing a semiconductor device according to claim 2, wherein said concave portion of said first cutting edge of said punch has a curved edge.

5. The method for manufacturing a semiconductor device according to claim 2, wherein said first cutting edge of said punch has a zigzag-shaped edge.

6. The method for manufacturing a semiconductor device according to claim 2, wherein said first cutting edge of said punch has a curved edge.

7. The method for manufacturing a semiconductor device according to claim 2, wherein said first cutting edge of said punch has a V-shaped edge.

8. The method for manufacturing a semiconductor device according to claim 2, wherein said first cutting edge of said punch has a U-shaped edge.

* * * * *